United States Patent [19]
Fisher et al.

[11] Patent Number: 5,903,977
[45] Date of Patent: May 18, 1999

[54] METHOD AND AN APPARATUS FOR MANUFACTURING HEATSINK DEVICES

[75] Inventors: Francis E. Fisher, Shaw; Robin D. Johnson, Bath, both of United Kingdom

[73] Assignee: Redpoint Thermalloy Limited, Wiltshire, United Kingdom

[21] Appl. No.: 08/856,823

[22] Filed: May 15, 1997

[30] Foreign Application Priority Data

May 16, 1996 [GB] United Kingdom .................. 9610287

[51] Int. Cl.⁶ .................................................. B23P 15/26
[52] U.S. Cl. ........................ 29/890.03; 29/727; 29/33 G
[58] Field of Search ................................ 29/33 G, 226, 29/727, 890.03, 890.053

[56] References Cited

U.S. PATENT DOCUMENTS

| | | | |
|---|---|---|---|
| 4,884,331 | 12/1989 | Hinshaw | 29/558 |
| 5,247,734 | 9/1993 | Lubbe et al. | 29/890.03 |
| 5,335,414 | 8/1994 | Joyce et al. | 29/726 |
| 5,407,698 | 4/1995 | Lipinski | 29/727 |
| 5,533,257 | 7/1996 | Romero | 29/890.03 |
| 5,542,176 | 8/1996 | Serizawa | 29/890.03 |
| 5,572,789 | 11/1996 | Fisher et al. | 29/890.03 |
| 5,590,712 | 1/1997 | Fisher et al. | 165/185 |
| 5,758,418 | 6/1998 | Chrysten et al. | 29/890.03 |

FOREIGN PATENT DOCUMENTS

| | | |
|---|---|---|
| 4427 854A1 | 2/1995 | Germany . |
| 06-198 383 A | 7/1994 | Japan . |
| 2 199 755 | 1/1988 | United Kingdom . |
| 2 278 307 | 5/1994 | United Kingdom . |

*Primary Examiner*—Irene Cuda
*Attorney, Agent, or Firm*—Woodcock Washburn Kurtz Mackiewicz & Norris LLP

[57] ABSTRACT

Heatsink devices are formed by attaching a plurality of fin members to a planar base member. A primary strip of thermally conducive material forms base members which are assembled with fin members formed from a secondary sheet of thermally conducting material. Each fin member is secured to a respective portion of the primary strip. The primary strip is advanced with the fin members secured thereto to be parted off to provide the heatsink devices. The synchronization of the forming of fins with the assembly reduces manual input to the manufacturing process, negates the need to hold stocks of preformed fins and increases design freedom with respect to dimensions of the heatsinks being formed.

28 Claims, 4 Drawing Sheets

METHOD AND AN APPARATUS FOR MANUFACTURING HEATSINK DEVICES

The present invention relates to a method and an apparatus for manufacturing heatsink devices, particularly heatsink devices of the type comprising a generally planar or block-like base member having a plurality of generally planar fin members secured thereto by means of soldering, brazing, riveting, press fitting or any other suitable method.

Conventionally, a manufacturing process for heatsink devices of the abovementioned type includes manually feeding preformed fin members to an assembly apparatus. The preformed fin members are located in groups on selected portions of a strip of suitable thermally conductive material being advanced through the assembly apparatus. The assembly apparatus secures the fin members to the strip by any suitable means including the aforementioned methods. For example, the assembly apparatus may comprise a press means which rivets bent over lower edge portions of the fin members to the strip. The selected portions of the strip are parted-off to provide heatsink devices.

One disadvantage of the conventional manufacturing process is the requirement for the fin members to be manually fed to the assembly apparatus. This is a labour intensive process which greatly increases the unit cost of the heatsink devices so formed.

A further disadvantage of the conventional manufacturing process is that the fin members must be preformed in advance of being assembled with the strip and are thus supplied in bulk in readiness for the assembly process. The assembly process is therefore dependent on the availability of preformed fin members. However, it is uneconomical to hold large stocks of different types of preformed fin members which are required for different heatsink device designs.

In the conventional manufacturing process, the assembly apparatus normally includes, in addition to the means for securing fin members to the strip, a blanking tool means. The blanking tool means preforms the strip to provide other features of the heatsink devices and to provide means for subsequently attaching to the strip/heatsink devices clip means or solder tags, for example, in advance of the process step of securing the fin members to the strip. The strip is advanced through the assembly apparatus in a step-wise manner by an amount defined as the pitch-length. The process steps of the blanking tool means and the securing means are coordinated by mechanical or electromechanical linkages with said step-wise advancement of the strip. A disadvantage of this arrangement is that the length of the heatsink devices so formed must be a multiple of the pitch-length of the assembly apparatus.

The number and spacing of fin members attached to a base member of a heatsink device is predetermined at the design stage having regard to the pitch-length of the assembly apparatus, the method by which the fin members are to be secured to the base member and the density of fin members necessary for a required heatsink operating performance. This enables fin members having appropriate dimensions to be preformed in bulk and for the tooling of the assembly apparatus to be installed in readiness for the assembly of a particular heatsink device design. However, if it is wished to change the design of a heatsink device being assembled, it is necessary to preform in bulk or retrieve from stock fin members of appropriate dimensions for the new design and to replace the tooling of the assembly apparatus. This is time consuming causing a considerable delay in the lead-in time for assembly of a different heatsink device design and, to reduce the lead-in time, requires large stocks of different sized fin members to be held.

It is an object of the present invention to provide a method and an apparatus which negates the need to manually feed the preformed fin members to an assembly apparatus in the manufacture of heatsink devices of the abovementioned type.

It is a further object of the present invention to provide a method and an apparatus which enables the design of heatsink devices being assembled to be altered automatically or with the minimum of manual intervention.

It is a yet further object of the present invention to provide a method and an apparatus which enables small production runs of a particular heatsink device design to be economically feasible.

According to a first aspect of the present invention, there is provided a method of manufacturing a heatsink device of the type comprising a generally planar or block-like base member to which a plurality of generally planar fin members is secured, the method comprising feeding to an assembly means a primary strip of thermally conductive material, feeding to at least one fin member forming means a secondary strip of thermally conductive material, forming fin members from said secondary strip of thermally conductive material in said fin forming means, transferring said formed fin members to the assembly means, transferring said fin members onto selected portions of the primary strip, securing each fin member to its respective portion of the primary strip and advancing said primary strip with the fin members secured thereto to a parting-off means at which said selected portions of the primary strip are parted-off to provide heatsink devices Preferably, the method includes controlling the fin member forming means to form fin members at a rate responsive to operating parameters of the assembly means.

Preferably, the method includes accumulating the fin members transferred from the fin member forming means to the assembly means into groups and transferring said groups onto the selected portions of the primary strip.

Preferably also, the method includes transferring fin members to the assembly means from two or more fin member forming means.

Preferably further, the method includes transferring the fin members formed by the two or more fin member forming means to the assembly means on a common transfer means.

Preferably further, the method includes utilising a primary strip of thermally conductive material provided in a rolled form wherein a means for feeding the primary strip to the assembly means includes means for unrolling the primary strip as it feeds into the assembly means.

Alternatively, the method may include utilising a primary strip comprising extruded lengths of thermally conductive material.

In the case where the primary strip comprises extruded lengths, the method may include preforming the extruded lengths to include longitudinally extending slots in a surface thereof to which the fin members are to be secured.

Preferably further, the method includes utilising a secondary strip of thermally conductive material provided in a rolled form or comprising extruded lengths of said material.

Preferably further, the method includes the step of utilising primary strips of different transverse widths for respective heatsink device designs, wherein the width of the primary strip determines one dimension of the base members of the heatsink devices being assembled.

Preferably further, the method includes presetting the length of the selected portions of the primary strip upon which the fin members are located to determine a second dimension of the base members of the heatsink devices being assembled.

Preferably further, the method includes utilising secondary strips of different transverse widths for respective heatsink device designs wherein the widths of the secondary strip determines at least one dimension of the fin members to be secured on the primary strip.

Preferably further, the method includes presetting the length of portions of the secondary strip to be preformed as blanks in order to define at least one other dimension of the fin members.

Preferably further, the method includes feeding the primary strip through a blanking tool means prior to feeding said strip to the assembly means wherein the blanking tool means preforms the primary strip to provide other features of a heatsink device design.

According to a second aspect of the present invention, there is provided an apparatus for manufacturing a heatsink device of the type comprising a generally planar or block-like base member to which a plurality of generally planar fin members is secured, the apparatus comprising means for feeding to an assembly means a primary strip of thermally conductive material, means for feeding to at least one fin member forming means a secondary strip of thermally conductive material, said fin member forming means forming fin members from said secondary strip of thermally conductive material, means for transferring said formed fin members to the assembly means, means for transferring said fin members onto selected portions of the primary strip, means for securing each fin member to its respective portion of the primary strip and means for advancing said primary strip with fin members secured thereto to a parting-off means at which said selected portions of the primary strip are parted-off to provide heatsink devices.

Preferably, the apparatus includes control means for presetting operating parameters of the apparatus such that the fin member forming means is controlled to form fin members at a rate responsive to preset operating parameters of the assembly means.

Preferably, the control means is a processor control means.

Preferably, the apparatus includes a means for accumulating the fin members transferred from the fin member forming means to the assembly means into groups and transferring said groups onto the selected portions of the primary strip.

Preferably also, the apparatus includes two or more fin member forming means.

Preferably further, the means for transferring the fin members formed by the two or more fin member forming means is common to said fin member forming means.

Preferably further, the apparatus is arranged to utilise a primary strip of thermally conductive material provided in a rolled form wherein the means for feeding the primary strip to the assembly means includes means for unrolling said primary strip as it feeds into said assembly means.

Alternatively, the apparatus may be arranged to utilise a primary strip comprising extruded lengths of thermally conductive material.

Preferably further, the apparatus is arranged to utilise a secondary strip of thermally conductive material provided in a rolled form or comprising extruded lengths of said material.

Preferably further, the apparatus is arranged to utilise primary strips of different transverse widths for respective heatsink device designs.

Preferably further, the control means of the apparatus enables the length of the selected portions of the primary strip upon which the fin members are located to be preset.

Preferably further, the apparatus is arranged to utilise secondary strips of different transverse widths for respective heatsink device designs.

Preferably further, the control means is arranged such that the length of portions of the secondary strip to be preformed as blanks can be preset.

Preferably further, the apparatus includes a blanking tool means for preforming the primary strip prior to said strip being fed by the feed means to the assembly means.

The foregoing and further features of the present invention will be more readily understood from the following description of preferred embodiments, by way of example thereof, with reference to the accompanying drawings, of which:

Figure 1:
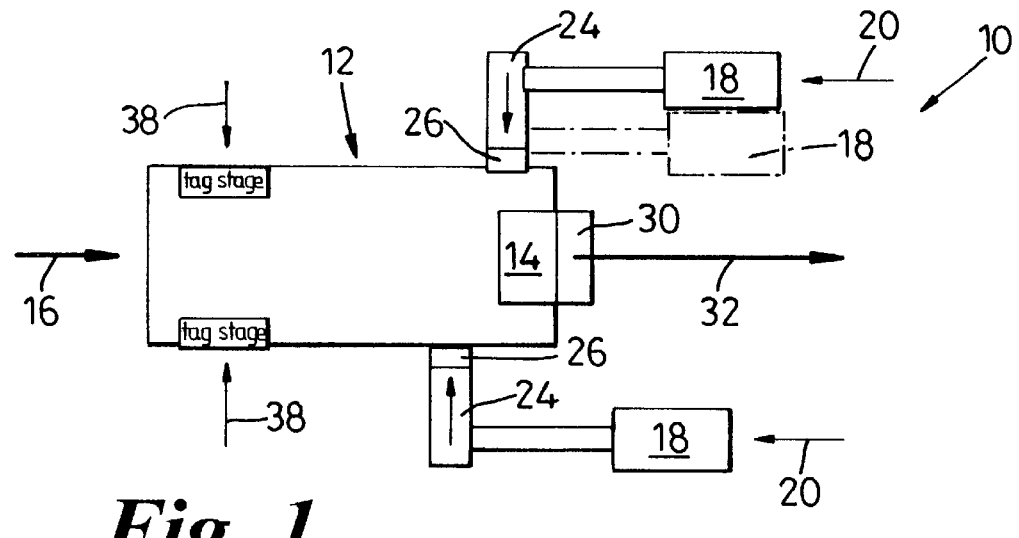
FIG. 1 is a schematic plan view of an apparatus in accordance with a first embodiment of the present invention.

Referring to FIG. 1, the apparatus 10 in accordance with the first embodiment of the present invention comprises an assembly means 12 including a main press means 14 into which a primary strip 16 of thermally conductive material in rolled form or extruded length form is fed. On each of two sides of the assembly means 12 is located a fin member forming means 18 into which a secondary strip 20 of thermally conductive material in rolled form or extruded length form is fed. The fin member forming means 20 comprises a blanking tool means (not shown), a press means (not shown) and an off-cutting means (not shown). The secondary strip 20 fed into the fin member forming means 18 is firstly preformed into a series of connected blanks of a preset length by the blanking tool means and the blanks are then advanced to the press means which presses said blanks into generally "U"-shaped fin members 22 comprising two coplanar fin portions 22(a,b) connected by their lower edges by a base portion 22c extending therebetween (see FIGS. 6 to 10). The press means engages each blank such that side portions thereof extending in the longitudinal direction of the secondary strip 20 are bent to form the coplanar fin portions 22(a,b). The strip of connected "U"-shaped members 22 so formed is advanced to the off-cutting means where each "U"-shaped member is parted from the strip. The "U"-shaped fin members 22 are conveyed by respective transfer means 24 to an accumulator means 26 comprising a part of the assembly means 12. The accumulator means 26 groups the "U"-shaped fin members 22 into groups of a preset number and then transfers each group onto selected portions (not shown) of the primary strip 16 advancing through the assembly means 12. The primary strip 16 with its respective groups of fin members 22 located on the selected portions thereof advances to the main press means 14 where said fin members 22 are press fitted into respective slots 28 preformed in at least the selected portions of the primary strip 16. The primary strip 16 with the fin members 22 secured thereto advances to a parting-off means 30 of the assembly means 12 whereby each selected portion of the primary strip 16 is parted from the strip thus providing heatsink devices 32 of the aforementioned type.

The assembly means 12 includes processor control means (not shown) which enables the length of the selected portions of the primary strip 16 onto which the groups of fin members 22 are located to be preset and enables the number of fin members 12 to be accumulated as a group to also be preset. The processor control means also allows the spacing of the fin members 22 in an accumulated group to be preset. Consequently, the length of a base member 34 of a heatsink device being assembled can be preset to any appropriate length and the number and spacing of fin members can also be preset. In addition, the processor control means also controls the fin member forming means 18 such that the rate at which said fin member forming means 18 forms fin members 22 results in the fin members 22 being conveyed to the assembly means 12 just in time. This provides useful economic advantages avoiding the necessity to hold large stocks of preformed fin members of different sizes and types and to allow design variations in a heatsink device being assembled.

The transverse width of the primary strip 16 determines the width of the base members 34 of the heatsink devices 32 being manufactured. The assembly means 12 is adapted to accept primary strips of different transverse widths thus allowing a further design variation in the heatsink devices being manufactured to be readily initiated.

The transverse width of the secondary strips 20 fed to the fin member forming means 18 determines the height of the fin portions 22(*a,b*) and width of the base portion 22*c* of the fin members 22 so formed and the preset length for off-cutting of the secondary strips 20 determines the longitudinal length of the fin members 22. Thus, the apparatus of the present invention provides a means of readily varying the size of heatsink devices being manufactured in three dimensions.

The blanking tool means of the fin member forming means 18 is arranged to also preform the longitudinally extending edge portions of the preformed blanks such that the planar fin portions 22(*a,b*) of the "U"-shaped fin members 22 are formed with portions removed or displaced therefrom to enhance the thermal dissipating efficiency of the "U"-shaped fin members 22. Thus, this allows heatsink devices 32 to be formed comprising a base member 32 with a plurality of "U"-shaped fin members 22 secured to a surface thereof wherein planar fin portions 22(*a, b*) of said "U"-shaped members 22 are formed with pin fin portions 22*d*, for example (refer to FIGS. 6 to 10).

The secondary strip 20 may also be preformed with apertures at suitable locations to provide a means by which the fin members 22 can be riveted to the primary strip 16 rather than press fitted into slots in said strip 16. The riveting process involves displacing the material of the primary strip 16 at a point coincident with an aperture in a fin member 22 such that the displaced portion of the primary strip 16 extends into and engages the aperture thus securing the fin member 22 to said strip 16. It will be appreciated that this process could be reversed with the apertures being preformed in the primary strip 16.

The assembly means also includes blanking tool means 36, whereby the primary strip 16 can be preformed so as to provide additional features to the base members 34 of the heatsink devices being assembled. For example, this may include preforming the primary strip 16 to provide a means of securing clip means (not shown) to the base members 34 of the heatsink devices 32 to enable said heatsink devices to be secured to electrical/electronic components. This may include attaching solder tags 38 to the primary strip 16 at suitable locations on the selected portions of said strip whereupon the solder tags enable a heatsink device 32 to be secured by soldering to an electrical/electronic component or a printed circuit board, for example.

It will be appreciated that the fin member forming means may be arranged to form fin members of other shapes including sheet form fin members.

It will be appreciated that for forming fin members of shapes other than the "U"-shaped form mentioned above will require replacement of the press tools in the fin member forming means. Accordingly, the fin member forming means are arranged such that the press tools can be readily interchanged with press tools for other fin member shapes.

Figure 2:
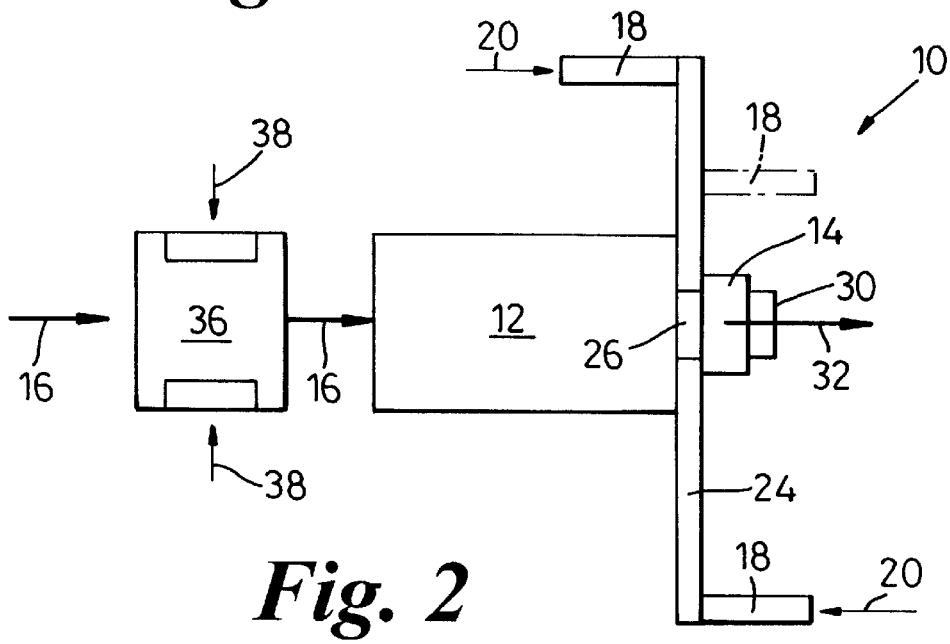
FIG. 2 is a schematic plan view of an apparatus in accordance with a second embodiment of the present invention.

FIG. 2 illustrates a schematic plan view of an apparatus 10 in accordance with a second embodiment of the invention. This embodiment has a similar arrangement to the first embodiment and therefore like numerals are used to denote like parts. This embodiment differs from the embodiment of FIG. 1 in that the fin member forming means 18 utilise a common transfer means 24 for conveying the "U"-shaped fin members 22 to the assembly means 12. Also, the blanking tool 36 means is provided as a separate apparatus to the assembly means 12 and the primary strip 16 is fed through the blanking tool means 36 prior to being fed to the assembly means 12. In the case where the primary strip 16 is provided in rolled form and thus has some flexibility, it is possible to loop feed the primary strip 16 from the blanking tool means 36 to the assembly means 12 whereby any change in the preset length of the selected portions of the primary strip in the assembly means 12 has no affect on the pitch-length of the blanking tool means 36.

Figure 3:
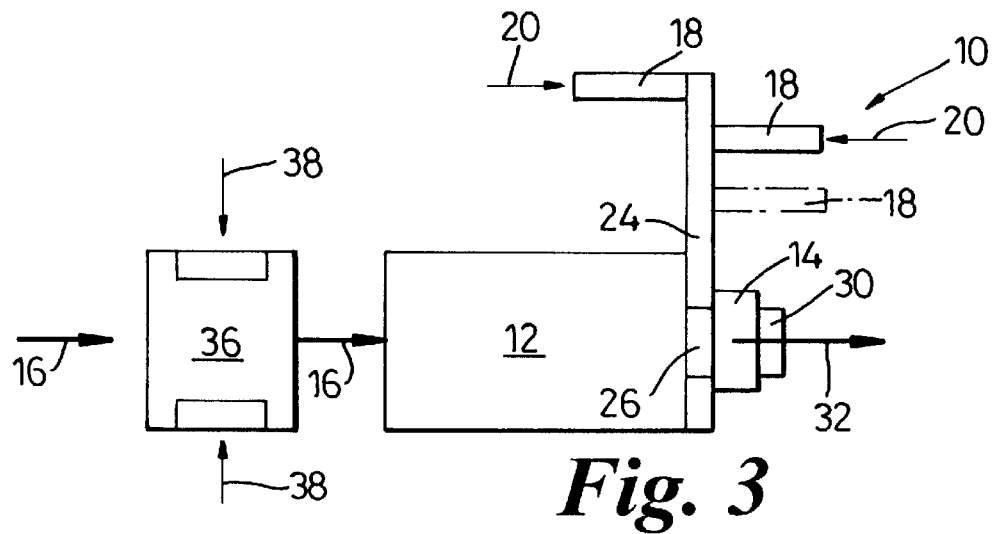
FIG. 3 is a schematic plan view of an apparatus in accordance with a third embodiment of the present invention.

FIG. 3 illustrates a schematic plan view of a further embodiment of the apparatus 10 of the present invention. This embodiment is similar to that of FIG. 2 in that it utilises a common transfer means 24 for conveying the "U"-shaped fin members 22 from the fin member forming means 18 to the assembly means 12, but the fin member forming means 18 are arranged to be all on one side of the assembly means 12 thus reducing the overall space requirements of the apparatus 10.

Figure 4:
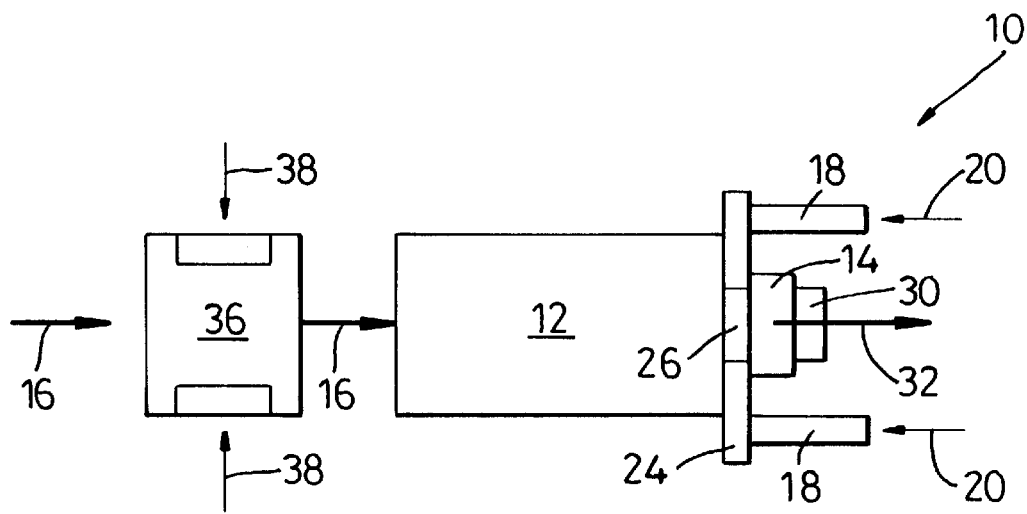
FIG. 4 is a schematic plan view of an apparatus in accordance with a fourth embodiment of the present invention.

FIG. 4 illustrates a schematic plan view of yet a further embodiment of the apparatus 10 of the present invention which has a similar arrangement to the embodiments of FIGS. 2 and 3, respectively, but wherein the assembly apparatus 10 utilises only two fin member forming means 18 with one located on each side of the assembly means 12 utilising a common transfer means 24.

Figure 5:
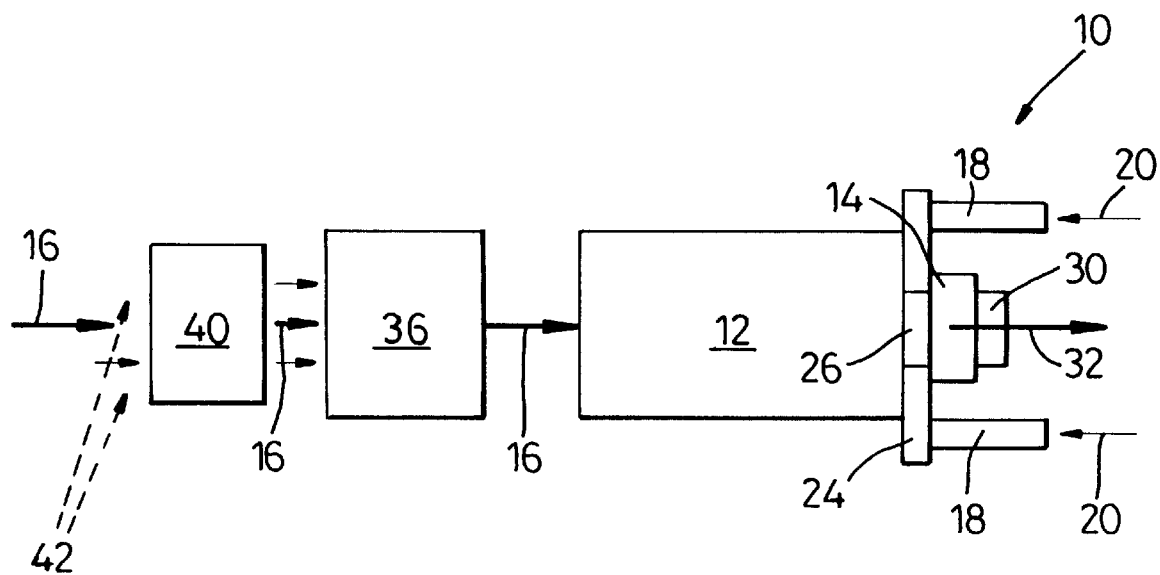
FIG. 5 is a schematic plan view of an apparatus in accordance with a fifth embodiment of the present invention.

FIG. 5 illustrates a schematic plan view of a yet further embodiment of the apparatus 10 of the present invention. This differs from the aforedescribed embodiments in that the means 40 for attaching solder tags 38 to the primary strip 16 is separate from both the blanking tool means 36 the assembly means 12 and is placed in advance of the blanking tool means 36. In this case, the solder tag attaching means 40 includes blanking tool means (not shown) for preforming tag strips 42 for providing the solder tags to be secured to the primary strip.

It will be appreciated that the various embodiments of the apparatus of the present invention are provided by way of example only and that the apparatus can be arranged to combine aspects from various of the embodiments.

Figure 6:
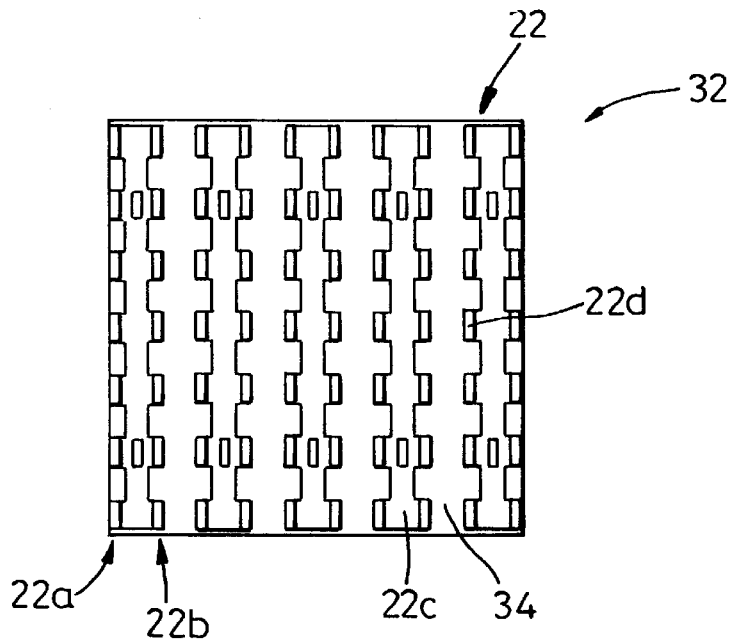
FIG. 6 is a plan view of a heatsink device which can be manufactured using the apparatus of the present invention.
Figure 7:
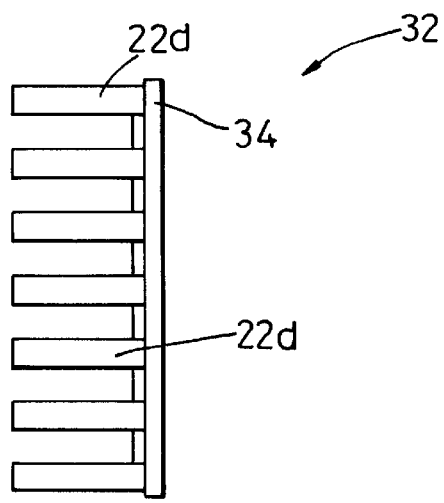
FIG. 7 is a side view of the heatsink device of FIG. 6.
Figure 8:
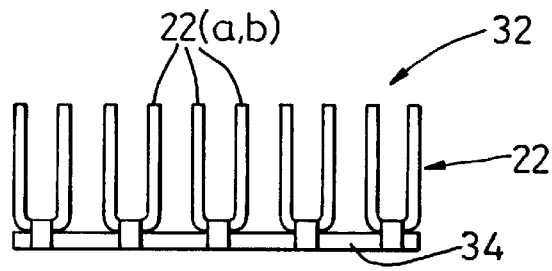
FIG. 8 is an end-on view of the heatsink device of FIG. 6.

FIGS. 6 to 8 show various views of an example of a heatsink device 32 which can be manufactured using the apparatus of the present invention. It will be seen that the heatsink device 32 comprises a planar base member 34 to which a plurality of spaced apart "U"-shaped members 22 are secured thereto by riveting. The "U"-shaped members 22 each comprise generally planar fin portions 22(*a,b*) connected by a base portion 22*c* wherein the generally planar fin portions 22(*a,b*) each comprise a series of pin fin portions 22*d* generally arranged in the planes of said fin portion 22(*a,b*). As indicated above, the apparatus of the present invention allows the transverse width and length of the base member 34 to be varied with minimum manual intervention in the manufacturing process and also allows the height of the pin fin portions 22*d* to be varied once again with minimal manual intervention. Thus, the heatsink device design can be varied in any one of three overall dimensions without requiring large stocks of preformed fin members to be held and the planar fin portions 22(*a,b*) can be formed with various pin fin 22*d* configurations.

Figure 9:
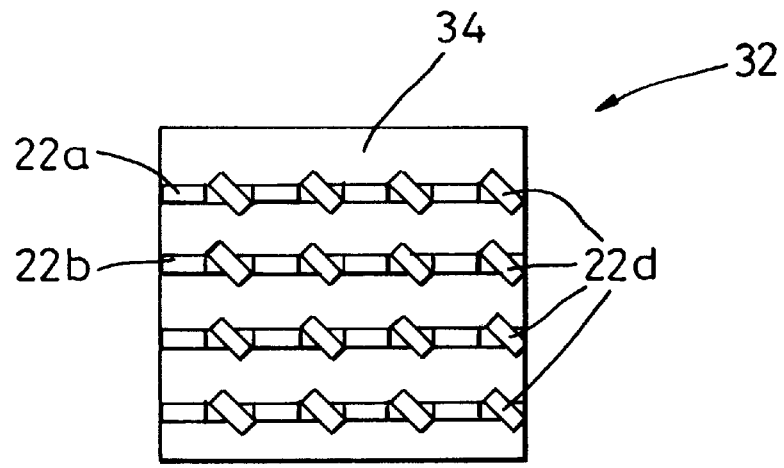
FIG. 9 is a plan view of another heatsink device which can be manufactured using the apparatus of the present invention.
Figure 10:
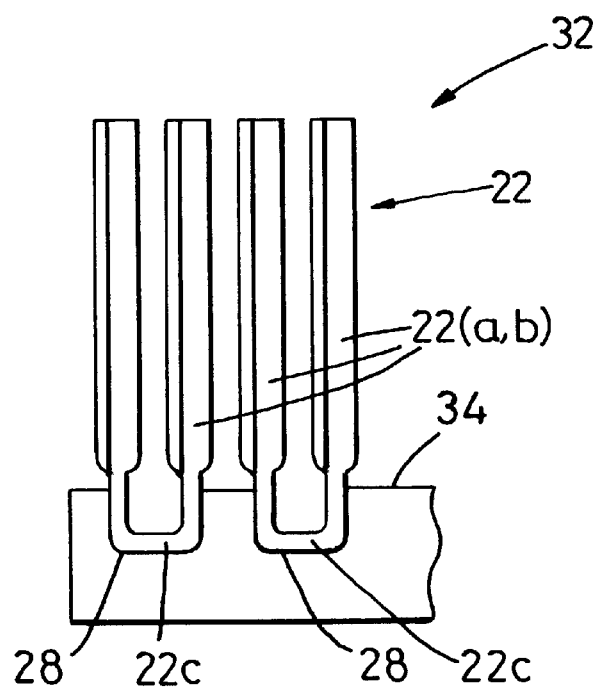
FIG. 10 is a partial end-on view of the heatsink device of FIG. 9.

FIGS. 9 and 10 show another example of a heatsink device 32 which can be formed using the apparatus of the present invention. In this case, the base member 34 comprises a block-like member formed from an extruded strip in which longitudinal slots 48 have been preformed to provide a means for securing the "U"-shaped members 22 to the block-like base member. In this example, the "U"-shaped members 22 are secured in position by being press fitted into the respective slots 28 in the base member 34. The "U"-shaped members 22 are preformed such that pin fin portions 22*d* thereof are twisted to lie in planes angled to the planes of the generally planar fin portions 22(*a,b*). Once again, the apparatus of the present invention allows the heatsink device design to be varied in any one of three overall dimensions with minimum manual intervention in the manufacturing process.

We claim:

1. A method of manufacturing a heatsink device of the type comprising a generally planar base member to which a plurality of generally planar fin members are secured, the method comprising feeding to an assembly means a primary strip of thermally conductive material, feeding to an assembly means a primary strip of thermally conductive material, feeding to at least one fin member forming means a secondary strip of thermally conductive material, forming fin members from said secondary strip of thermally conductive material in said fin member forming means, transferring said formed fin members to said assembly means, transferring said fin members onto selected portions of said primary strip, securing each fin member to its respective portion of said primary strip and advancing said primary strip with the fin members secured thereto to a parting-off means at which said selected portions of the primary strip are parted-off to provide heatsink devices.

2. A method as claimed in claim 1 further comprising: controlling said fin member forming means to form fin members at a rate responsive to operating parameters of the assembly means.

3. A method as claimed in claim or claim 2, further comprising: accumulating the fin members transferred from the fin member forming means to the assembly means into groups and transferring said groups onto the selected portions of the primary strip.

4. A method as claimed in claim 1 or 2, further comprising: transferring fin members to the assembly means from two or more fin member forming means.

5. A method as claimed in claim 1 or 2, further comprising: transferring the fin members formed by said at least one fin member forming means to the assembly means on a common transfer means.

6. A method as claimed in claim 1 or 2, further comprising: utilising a primary strip of thermally conductive material provided in a rolled form wherein a means for feeding the primary strip to the assembly means includes means for unrolling the primary strip as it feeds into the assembly means.

7. A method as claimed in claim 1, further comprising: utilising a primary strip comprising extruded lengths of thermally conductive material.

8. A method as claimed in claim 7, further comprising: preforming the extruded lengths to include longitudinally extending slots in a surface thereof to which the fin members are to be secured.

9. A method as claimed in any one of claims 1, 2, 7 or 8, further comprising: utilising a secondary strip of thermally conductive material provided in a rolled form.

10. A method as claimed in claim 1, further comprising the step of utilising primary strips of different transverse widths for respective heatsink device designs, wherein the width of the primary strip determines one dimension of the base members of the heatsink devices being assembled.

11. A method as claimed in claim 10, wherein it includes presetting the length of the selected portions of the primary strip upon which the fin members are located to determine a second dimension of the base members of the heatsink devices being assembled.

12. A method as claimed in claim 10, further comprising utilising secondary strips of different transverse width for respective heatsink device designs wherein the width of the secondary strip determines at least one dimension of the fin members to be secured on the primary strip.

13. A method as claimed in claim 12, further comprising: presetting the length of portions of the secondary strip to be preformed as blank in order to define at least one other dimension of the fin members.

14. A method as claimed in any one of preceding claims 1, 2, 7, 8, 10, 11, 12 or 13, further comprising: feeding the primary strip through a blanking tool means prior to feeding said strip to the assembly means wherein the blanking tool means preforms the primary strip to provide other features of a heatsink device design.

15. An apparatus for manufacturing a heatsink device of the type comprising a generally planar base member to which a plurality of generally planar fin members are secured, the apparatus comprising:

means for feeding to an assembly means a primary strip of thermally conductive material, means for feeding to at least one fin member forming means a secondary strip of thermally conductive material, said fin member forming means forming fin member from said secondary strip of thermally conductive material, means for transferring said formed fin members to the assembly means, means for transferring said fin members onto selected portions of the primary strip, means for securing each fin member to its respective portion of the primary strip and means for advancing said primary strip with fin members secured thereto to the parting-off means at which said selected portions of the primary strip are parted-off to provide heatsink devices.

16. An apparatus as claimed in claim 15, further comprising control means for presetting operating parameters of the apparatus such that the fin member forming means is controlled to form fin members at a rate responsive to preset operating parameters of the assembly means.

17. An apparatus as claimed in claim 16, wherein the control means is a processor control means.

18. An apparatus as claimed in any one of claims 15 to 17, wherein the apparatus includes a means for accumulating the fin members transferred from the fin member forming means to the assembly means into groups and transferring said groups onto the selected portions of the primary strip.

19. An apparatus as claimed in any one of claims 15 to 17, further comprising: two or more fin member forming means.

20. An apparatus as claimed in claim 19, wherein the means for accumulating the means for transferring the fin members formed by the two or more fin member forming means is common to said fin member forming means.

21. An apparatus as claimed in any one of claims 15 to 18, arranged to utilise a primary strip of thermally conductive material provided in a rolled form wherein said means for feeding the primary strip to the assembly means includes means for unrolling said primary strip as it feeds into said assembly means.

22. An apparatus as claimed in any one of claims 15 to 18, arranged to utilise a primary strip comprising extruded lengths of thermally conductive material.

23. An apparatus as claimed in any one of claims 15 to 18, arranged to utilise a secondary strip of thermally conductive material provided in a rolled form or comprising extruded lengths of said material.

24. An apparatus as claimed in any one of claims 15 to 18, arranged to utilise primary strips of different transverse widths for respective heatsink device designs.

25. An apparatus as claimed in claim 16, wherein said control means enables the length of the selected portions of the primary strip upon which the fin members are located to be preset.

26. An apparatus as claimed in claim 25, arranged to utilise secondary strips of different transverse widths for respective heatsink device designs.

27. An apparatus as claimed in claim 26, wherein the control means is arranged such that the length of portions of the secondary strip to be preformed as blanks can be reset.

28. An apparatus as claimed in any one of claims 15 to 18, further comprising: a blanking tool means for preforming the primary strip prior to said strip being fed by the feed means to the assembly means.

* * * * *